(12) United States Patent
Hwang et al.

(10) Patent No.: US 10,476,308 B2
(45) Date of Patent: Nov. 12, 2019

(54) MAGNETIC RESONANCE WIRELESS POWER TRANSMISSION DEVICE CAPABLE OF ADJUSTING RESONANCE FREQUENCY

(71) Applicant: MAPS, INC., Yongin-si (KR)

(72) Inventors: Jong-Tae Hwang, Seoul (KR); Hyun-Ick Shin, Seoul (KR); Dong-Su Lee, Dongducheon-si (KR); Jong-Hoon Lee, Seongnam-si (KR); Sang-O Jeon, Suwon-si (KR); Ik-Gyoo Song, Incheon (KR); Dae-Ho Kim, Yongin-si (KR); Joon Rhee, Seoul (KR)

(73) Assignee: MAPS, Inc., Yongin-si (KR)

( * ) Notice: Subject to any disclaimer, the term of this patent is extended or adjusted under 35 U.S.C. 154(b) by 180 days.

(21) Appl. No.: 15/502,062

(22) PCT Filed: Jul. 31, 2015

(86) PCT No.: PCT/KR2015/008035
§ 371 (c)(1),
(2) Date: Feb. 6, 2017

(87) PCT Pub. No.: WO2016/021881
PCT Pub. Date: Feb. 11, 2016

(65) Prior Publication Data
US 2017/0229921 A1    Aug. 10, 2017

(30) Foreign Application Priority Data

Aug. 6, 2014 (KR) .......................... 10-2014-0101301

(51) Int. Cl.
*H02J 50/12* (2016.01)
*H03F 3/217* (2006.01)

(52) U.S. Cl.
CPC ............ *H02J 50/12* (2016.02); *H03F 3/2173* (2013.01); *H03F 2200/243* (2013.01)

(58) Field of Classification Search
None
See application file for complete search history.

(56) References Cited

U.S. PATENT DOCUMENTS

| | | | |
|---|---|---|---|
| 5,898,579 A | * | 4/1999 | Boys ....................... B60L 5/005 363/23 |
| 9,384,885 B2 | | 7/2016 | Karalis et al. |
| (Continued) | | | |

FOREIGN PATENT DOCUMENTS

| | | |
|---|---|---|
| KR | 10-2014-0034982 A | 3/2014 |
| KR | 10-2014-0053282 A | 5/2014 |

OTHER PUBLICATIONS

International Search Report issued in counterpart International Application No. PCT/KR2015/008035 dated Nov. 16, 2015 (3 pages in Korean, 2 pages in English).

*Primary Examiner* — Jared Fureman
*Assistant Examiner* — James P Evans
(74) *Attorney, Agent, or Firm* — NSIP Law

(57) ABSTRACT

A magnetic resonance wireless power transmission device capable of adjusting resonance frequency is disclosed. A wireless power transmission device according to an embodiment of the present invention comprises: a power amplifier for amplifying a wireless power signal using a driving frequency signal; a resonator for configuring a resonance tank and wirelessly transmitting, through magnetic resonance, the wireless power signal output from the power amplifier using a resonance frequency of the resonance tank; and a resonance control unit for controlling a duty ratio using a frequency applied to the resonator or a frequency signal generated by the resonator and adjusting the resonance frequency of the resonator.

7 Claims, 25 Drawing Sheets

(56) References Cited

U.S. PATENT DOCUMENTS

| | | | |
|---|---|---|---|
| 2012/0056486 A1* | 3/2012 | Endo | H02J 5/005 |
| | | | 307/104 |
| 2012/0169137 A1 | 7/2012 | Lisi et al. | |
| 2012/0235636 A1* | 9/2012 | Partovi | H02J 7/025 |
| | | | 320/108 |
| 2012/0287985 A1 | 11/2012 | Okamura et al. | |
| 2013/0020862 A1 | 1/2013 | Miller | |
| 2013/0033118 A1* | 2/2013 | Karalis | H01F 38/14 |
| | | | 307/104 |
| 2014/0077613 A1 | 3/2014 | Song et al. | |
| 2014/0159500 A1* | 6/2014 | Sankar | H02J 50/12 |
| | | | 307/104 |
| 2015/0207333 A1* | 7/2015 | Baarman | H02J 5/005 |
| | | | 307/104 |
| 2015/0280453 A1* | 10/2015 | Ikefuji | H04B 5/0037 |
| | | | 320/108 |
| 2015/0303806 A1* | 10/2015 | Madsen | H02M 7/5383 |
| | | | 323/271 |

* cited by examiner (a) Average Capacitance Controlled resonant frequency tuning (b)

MAGNETIC RESONANCE WIRELESS POWER TRANSMISSION DEVICE CAPABLE OF ADJUSTING RESONANCE FREQUENCY

CROSS REFERENCE TO RELATED APPLICATION(S)

This application is a National Phase entry of PCT Application No. PCT/KR2015/008035, filed on Jul. 31, 2015, which claims priority under 35 U.S. C. § 119(e), 120 and 365(c) to Korean Patent Application No. 10-2014-0101301, filed on Aug. 6, 2014 in the Korean Intellectual Property Office, the entire disclosures of each of which are incorporated herein by reference for all purposes.

TECHNICAL FIELD

The present invention relates to a wireless power transmission technology, and more particularly, to a wireless power transmission technology using magnetic resonance.

BACKGROUND ART

FIG. 1 is a configuration diagram of a general magnetic resonance wireless power transmission system.

Referring to FIG. 1, a magnetic resonance wireless power transmission system 1 includes a power transmitting unit (PTU) 10 that supplies a power signal through magnetic resonance and a power receiving unit (PRU) 12 that receives the power signal from the PTU 10.

The PTU 10 includes a power amplifier 100 and a resonator 110. The power amplifier 100 includes N-channel metal oxide semiconductors (NMOSs) M1 101 and M2 102, and the resonator 110 includes a capacitor (Cs) 111 and an inductor (L) 112. In FIG. 1, the power amplifier 100 is limited to class-D, but may be replaced by a class-AB or class-B power amplifier. The power amplifier is operated at a driving frequency (fdrv) 103. Therefore, an output of the power amplifier 100 composed of M1 101 and M2 102 is in the form of a square wave which varies between a supply voltage (VSUP) 104 and a ground voltage 105 at the driving frequency (fdrv) 103. According to alliance for wireless power (A4WP), which is a resonant wireless power transfer standard, the driving frequency fdrv is set to 6.78 MHz. The output of the power amplifier 100 is applied to the resonator 110 composed of the capacitor (Cs) 111 and the inductor (L) 112. Here, L 112 denotes an 101 equivalent inductance of a transmission (TX) antenna, and Resr 113 is a parasitic resistance component of the antenna. A resonant frequency $f_{R,PTU}$ of the PTU resonator 110 is shown in Expression 1.

$$f_{R,PTU} = \frac{1}{2\pi\sqrt{L \cdot Cs}} \quad \text{[Expression 1]}$$

In general, the resonant frequency $f_{R,PTU}$ is controlled to be identical to the driving frequency fdrv, and in some cases, the resonant frequency $f_{R,PTU}$ is slightly lower than the driving frequency fdrv to increase efficiency of the power amplifier 100. Since the transistors M1 101 and M2 102 can perform zero-voltage switching (ZVS) when this condition is satisfied, switching loss can be remarkably reduced.

Meanwhile, the PRU 12 that receives a wireless power signal includes a resonator 120 composed of a capacitor (Cs1) 122 and an inductor (L1) 124 serving as an antenna, a rectifier 130 composed of diodes D1 to D4, and a direct current (DC)-DC converter 140. Since an output of the rectifier 130 is a rectified voltage, a capacitor CRECT is used to convert the rectified voltage into a DC voltage. After a DC voltage VRECT generated by the capacitor CRECT is converted into a suitable voltage for a load 150 using the DC-DC converter 140, the load 150 is operated. The DC-DC converter 140 may employ a linear low dropout (LDO) regulator, a switching converter, a charge pump, etc., but is not limited thereto. As shown in FIG. 1, the rectifier 130 may be a full-wave rectifier, but can also be implemented using a half-wave rectifier. As shown in FIG. 1, the rectifier 130 may be implemented using the passive-device diodes D1 to D4, but can also be implemented as an active rectifier using an active device.

A resonant frequency of the PRU resonator 120 is determined as shown in Expression 2.

$$f_{R,PRU} = \frac{1}{2\pi\sqrt{L1 \cdot Cs1}} \quad \text{[Expression 2]}$$

When the resonators 110 and 120 of the PTU 10 and the PRU 12 have the same resonant frequency and the two antennas 112 and 124 are close to each other, magnetic resonance occurs. At this time, energy is transferred from the antenna 112 of the PTU to the antenna 124 of the PRU.

Since energy is not effectively transferred when resonant frequencies of the resonators 110 and 120 differ from each other, it is very important to match the resonant frequencies of the resonators 110 and 120 the same. A method of tuning passive devices, an inductor (L) and a capacitor (C) is generally used to match resonance characteristics of the PTU 10 and the PRU 12. However, since the method of tuning passive devices involves physically tuning L and C, productivity is low, and it is not easy to cope with a case in which L and C values are changed due to an external factor.

In terms of efficiency, it is most efficient for the PTU 10 to transmit as much power as is required by the PRU 12. However, when too much energy is transmitted, the voltage VRECT of the PRU 12 increases excessively and destroys the rectifier 130 and the DC-DC converter 140, and when too little energy is transmitted, it is not possible to supply a desired power to the load 150. Therefore, the PTU 10 receives feedback with a requirement of the PRU 12 and controls the output power. According to A4WP, the PTU 10 and the PRU 12 communicate with each other using Bluetooth communication. There are generally three methods by which the PTU 10 controls power.

(1) Driving frequency control
(2) Power amplifier burst switching control
(3) Power amplifier supply voltage control Driving frequency control involves changing the driving frequency of the power amplifier 100. Since energy supplied to the PTU resonator 110 can be changed, power control is possible. This method is used by a resonant inverter, Qi and power matters alliance (PMA), which are inductive wireless power transfer methods. However, according to standards such as A4WP, since a driving frequency is fixed, such control is difficult.

Power amplifier burst switching control involves controlling an average power applied to the resonator 110 by operating or not operating the power amplifier 100. This may be referred to as a burst switching operation. This method is used to transmit power according to near field communication (NFC) and so on. Since a frequency spectrum is generated in a form in which the driving frequency of the power amplifier 100 and a burst frequency are modulated in this method, it is possible to think that a radiated frequency is generated with a predetermined width. Since a frequency permitted in A4WP is about 6.78±15 kHz, such control is possible, but it is necessary to prevent the frequency from exceeding the bandwidth.

FIG. 2 is a configuration diagram of a magnetic resonance wireless power transmission system using power amplifier supply voltage control.

Referring to FIG. 2, it is possible to adjust energy supplied to a resonator 260 by controlling a supply voltage (VSUP) 250 of a power amplifier 220 with a DC-DC converter 240 positioned between a supply 200 and the power amplifier 220. Since the above-described method can be used even when a structure of the power amplifier 220 is not class-D, the above-described method is the most flexible method. However, additional cost is required to configure the DC-DC converter 240, and there is a risk that loss of the DC-DC converter 240 will reduce the overall efficiency of the wireless power transmission system.

FIG. 3 is a circuit diagram of a wireless power transfer unit that controls supply of power by controlling a switch device.

Referring to FIG. 3, after energy is transferred to a resonant tank using an inductor 300 and a capacitor 310 and converted into a DC through diodes 320 and 330, the energy is supplied to a load 360 using a control circuit 340. In this case, the control circuit 340 controls the switch device 350, thereby controlling power supplied to the load 360.

FIG. 4 is a configuration diagram of a wireless power transfer unit using a resonant frequency control method employing a clock signal.

Referring to FIG. 4, N1 410 is operated as a resistance so that Vout 400 becomes a desired voltage, or N1 410 is controlled as a switch using a clock signal 420 to control Vout 400. According to this method, a resonant frequency of a resonator is changed to adjust energy received by a resonant tank.

DISCLOSURE

Technical Problem

The present invention is directed to providing a method of actively controlling a resonant frequency in a wireless power transmission system.

Technical Solution

One aspect of the present invention provides a wireless power transmitting unit including: a power amplifier configured to amplify a wireless power signal using a driving frequency signal; a resonator configured to constitute a resonant tank and wirelessly transmit a wireless power signal output from the power amplifier through magnetic resonance using a resonant frequency of the resonant tank; and a resonance controller configured to tune the resonant frequency of the resonator by controlling a duty ratio with a frequency applied to the resonator or a frequency signal generated by the resonator.

The resonator may include: a first capacitor; an inductor connected in series with the first capacitor; a second capacitor connected in parallel with the inductor and connected in series with the first capacitor; and a switch connected in series with the second capacitor, and the resonant frequency may be tuned according to a period in which the second capacitor is charged by the duty ratio control of the resonance controller for the switch.

The resonance controller may generate a switch driving signal using the frequency applied to the resonator or the frequency generated by the resonator, operate the switch of the resonator using the switch driving signal, and tune the resonant frequency by actively controlling the effective amount of capacitance by periods through duty ratio control of the switch. At this time, the resonance controller may control the duty ratio of the switch by changing a tuning voltage applied to a gate of the switch. The resonance controller may control a duty ratio of the switch by amplifying the tuning voltage.

The resonance controller may extract a frequency component from the signal applied to the resonator or the signal generated by the resonator and directly change a duty ratio of an extracted frequency signal.

When the resonance controller tunes the resonant frequency, a magnitude of a current supplied from an output terminal of the power amplifier by the driving frequency may be adjusted, and a supply power of the power amplifier may be adjusted.

Advantageous Effects

According to an exemplary embodiment, a resonant frequency can be electrically tuned. In other words, resonant frequencies are not regularized by adjusting a passive device, and the resonant frequency can be tuned with only an electric signal without tuning a passive device. Since resonant frequency tuning and power control are possible without changing a driving frequency fdrv, the present invention is suited to standards, such as alliance for wireless power (A4WP), and control is possible without a direct current (DC)-DC converter. Since power control is possible even when a resonant frequency of a resonant tank differs from a desired frequency, control can be performed to cope with scattering of inductance of an antenna or scattering of capacitances of resonator capacitors. Therefore, it is possible to implement a highly reproducible wireless power transmission system. Further, energy supplied to the resonator is changed by tuning the resonant frequency so that power supplied to a power receiving unit (PRU) can be controlled.

MODES OF THE INVENTION

Hereinafter, exemplary embodiments of the present invention will be described in detail with reference to the accompanying drawings. In the following description of the present invention, a detailed description of a known art related to the present invention will be omitted when determined to unnecessarily obscure the subject matter of the present invention. Also, the terms used in the following description are terms defined in consideration of functions in the exemplary embodiments of the present invention and may vary depending on a user's or an operator's intention, practice, or so on. Therefore, definitions of terms used herein should be made based on the content throughout the specification.

A wireless power transmission system of the present invention tunes a resonant frequency using an active resonant frequency tuning method. To tune the resonant frequency, a duty ratio is controlled using a frequency component applied to a resonator or a frequency component generated by the resonator rather than a clock signal. For example, a resonant frequency of a resonant tank of a power amplifier or a power receiving unit (PRU) is not controlled using the clock signal, but a frequency signal identical to a signal applied to the resonator or the signal generated by the resonator is extracted from the signal and the resonant frequency is actively tuned by controlling a duty ratio representing a pulse width with the extracted frequency signal.

Using the above-described resonant frequency tuning method based on duty control, tuning is possible even when resonance characteristics of a power transmitting unit (PTU) and a PRU are not identical to each other. Also, it is possible to control power supplied to the PRU from the PTU. Further, since resonant frequency tuning and power control are possible without changing a driving frequency fdrv, the above-described resonant frequency tuning method based on duty control is suited to standards, such as alliance for wireless power (A4WP), and control is possible without a direct current (DC)-DC converter. Since power control is possible even when a resonant frequency of a resonant tank differs from a desired frequency, control can be performed to cope with scattering of inductance of an antenna or scattering of capacitances of resonator capacitors. Therefore, it is possible to implement a highly reproducible wireless power transmission system.

A basic principle of the present invention will be described below with reference to FIGS. 5 to 10, and then a wireless power transmission system for tuning a resonant frequency using duty control and a resonant frequency tuning method according to the present invention will be described in detail with reference to FIGS. 11 to 25.

Figure 5:
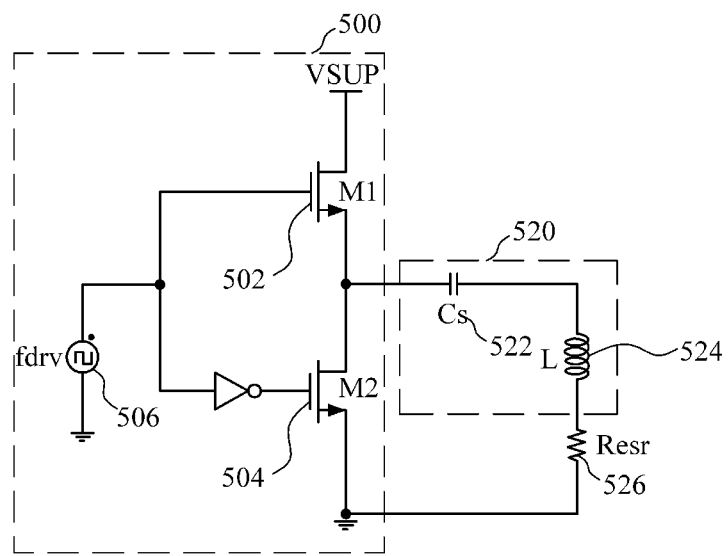
FIG. 5 is a circuit diagram of a class-D power amplifier having a serial resonant tank.

FIG. 5 is a circuit diagram of a class-D power amplifier having a serial resonant tank.

Referring to FIG. 5, transistors (M1 and M2) 502 and 504 of a class-D power amplifier 500 supply energy to a serial resonant tank 520 composed of a capacitor (Cs) 522 and an inductor (L) 524 by being alternately turned on and off by a driving frequency (fdrv) 506. A resonant frequency is shown in Expression 3 and generally tuned to be equal to or slightly lower than the driving frequency fdrv.

$$f_{RPTU} = \frac{1}{2\pi\sqrt{L \cdot Cs}} \quad \text{[Expression 3]}$$

An antenna can be modeled with the inductor (L) 524, and Resr 526 is the equivalent of a parasitic resistance component of the antenna. A resonant frequency of the PTU needs to be synchronized with the driving frequency fdrv and a resonant frequency of the PRU to transmit energy to the PRU with high efficiency. However, since the capacitor (Cs) 522 and the inductor (L) 524 have a scattering characteristic, it is not easy to maintain a constant resonant frequency, and in some cases, physical tuning is required to change values of the capacitor (Cs) 522 and the inductor (L) 524.

Figure 6:
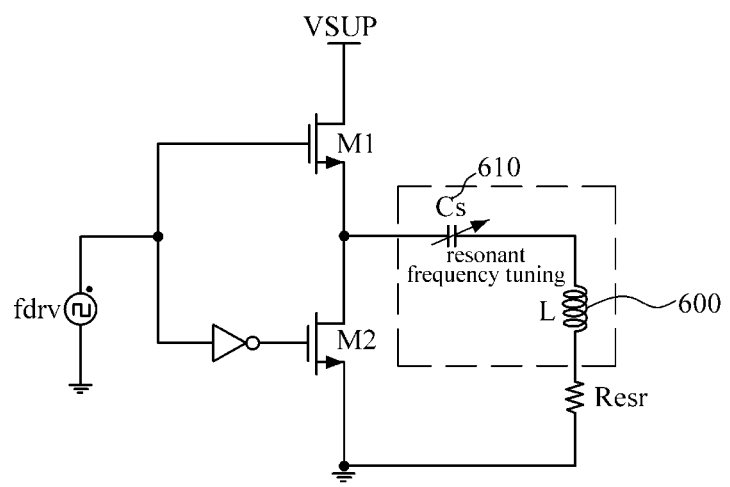
FIG. 6 is a circuit diagram of a wireless power transmitting unit whose resonant frequency is tuned by changing a value of a capacitor Cs of a resonator.

FIG. 6 is a circuit diagram of a wireless power transmitting unit whose resonant frequency is tuned by changing a value of a capacitor Cs of a resonator.

Referring to FIG. 6, since an inductor (L) 600 has a fixed physical form, it is not easy to change the inductor (L) 600 to tune a resonant frequency. Also, the inductor (L) 600 has a relatively large size. Therefore, it is more convenient to tune a capacitor (Cs) 610 than tune the inductor (L). When the capacitor (Cs) 610 is tuned, the resonant frequency may be changed. By connecting or disconnecting a plurality of capacitors with a plurality of switches, a total amount of capacitance is changed and the same effect as tuning the capacitor (Cs) 610 is brought about. The capacitor Cs tuning method is a control method that is very simple and reliable in terms of concept. However, since both-end voltages of the capacitor (Cs) 610 are not fixed and frequently change, it is not easy to implement this method using a semiconductor switch. Also, since many passive devices and switches are required, there is a problem of an increase in the unit cost of production.

Figure 7:
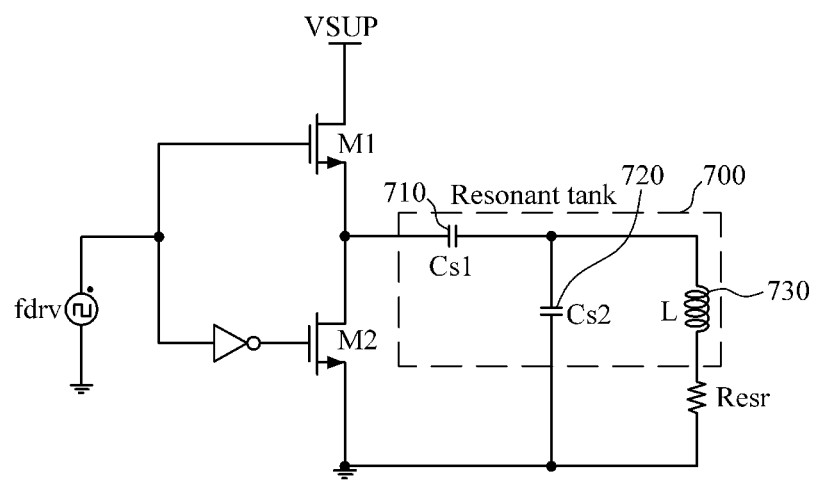
FIG. 7 is a circuit diagram of a wireless power transmitting unit having a capacitor-capacitor-inductor (CCL) resonant tank.

FIG. 7 is a circuit diagram of a wireless power transmitting unit having a capacitor-capacitor-inductor (CCL) resonant tank.

Referring to FIG. 7, a capacitor (Cs1) 710 is connected in series with an antenna 730, and a capacitor (Cs2) 720 is connected in parallel with the antenna 730 so that a CCL-type resonant tank 700 is formed.

Here, a resonant frequency $F_R$ is changed as shown in Expression 4 below.

$$f_R = \frac{1}{2\pi\sqrt{L1 \cdot (Cs1 + Cs2)}} \quad \text{[Expression 4]}$$

A resonant frequency $f_P$ is determined by the capacitors (Cs1 and Cs2) 710 and 720.

Figure 8:
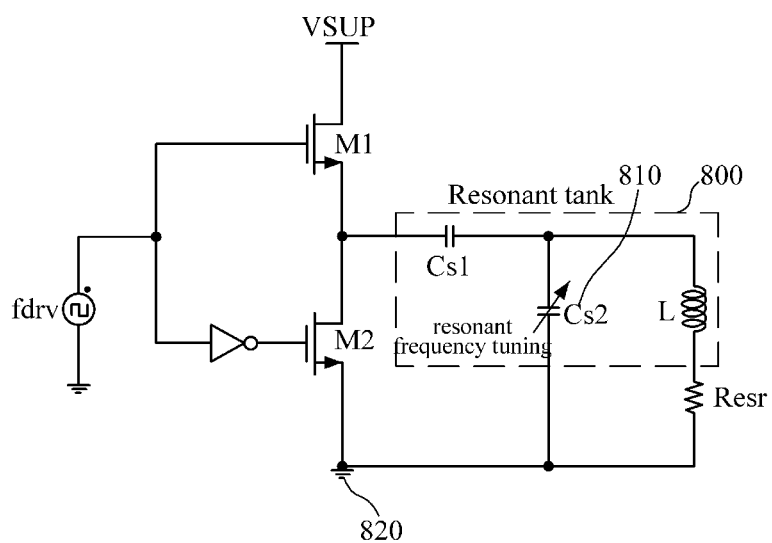
FIG. 8 is a circuit diagram illustrating a resonant frequency tuning method employing a parallel capacitor Cs2 in the wireless power transmitting unit of FIG. 7 having the CCL resonant tank.

FIG. 8 is a circuit diagram illustrating a resonant frequency tuning method employing a parallel capacitor Cs2 in the wireless power transmitting unit of FIG. 7 having the CCL resonant tank.

Referring to FIG. 8, a resonant frequency can be changed by tuning a parallel capacitor (Cs2) 810 in a wireless power transmitting unit having a CCL resonant tank 800. Here, since one node of the capacitor (Cs2) 810 is determined to be a ground 820, it is easy to implement a control circuit.

Figure 9:
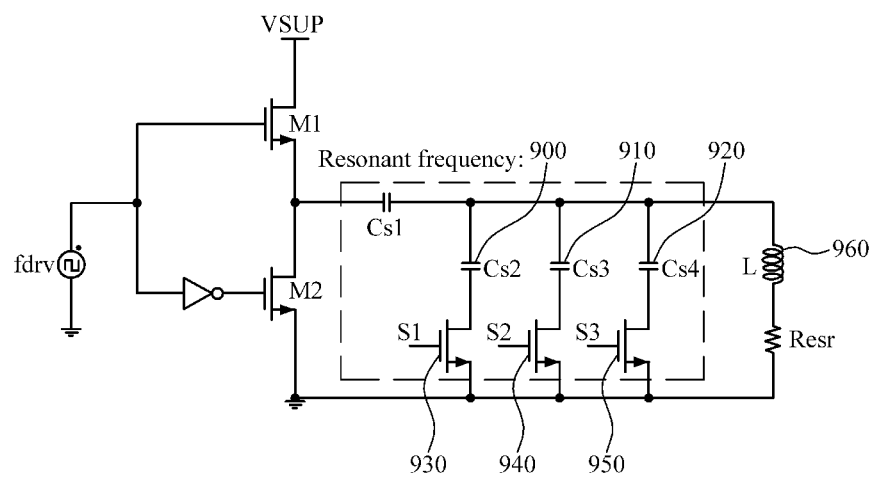
FIG. 9 is a circuit diagram of a wireless power transmitting unit illustrating a resonant frequency tuning method employing a capacitor bank and a switch array.

FIG. 9 is a circuit diagram of a wireless power transmitting unit illustrating a resonant frequency tuning method employing a capacitor bank and a switch array.

Referring to FIG. 9, a resonant frequency can be tuned using a plurality of capacitors (C2s, Cs3, and Cs4) 900, 910 and 920 and a plurality of switches (S1, S2, and S3) 930, 940, and 950. Here, the resonant frequency can be tuned within a range shown in Expression 5 below.

$$\frac{1}{2\pi\sqrt{L1 \cdot (Cs1 + Cs2 + Cs3 + Cs4)}} \le f_R \le \frac{1}{2\pi\sqrt{L1 \cdot Cs1}} \quad \text{[Expression 5]}$$

Referring to Expression 5, the resonant frequency is highest when all the switches (S1 to S3) 930 to 950 are turned off, and is lowest when all the switches (S1 to S3) 930 to 950 are turned on. The above-described method simplifies frequency tuning but requires many devices. In particular, since a voltage of an inductor can be very high around the resonant frequency, the switches S1 to S3 should be able to tolerate a high voltage stress when turned off and should be devices having a high breakdown voltage.

Figure 10:
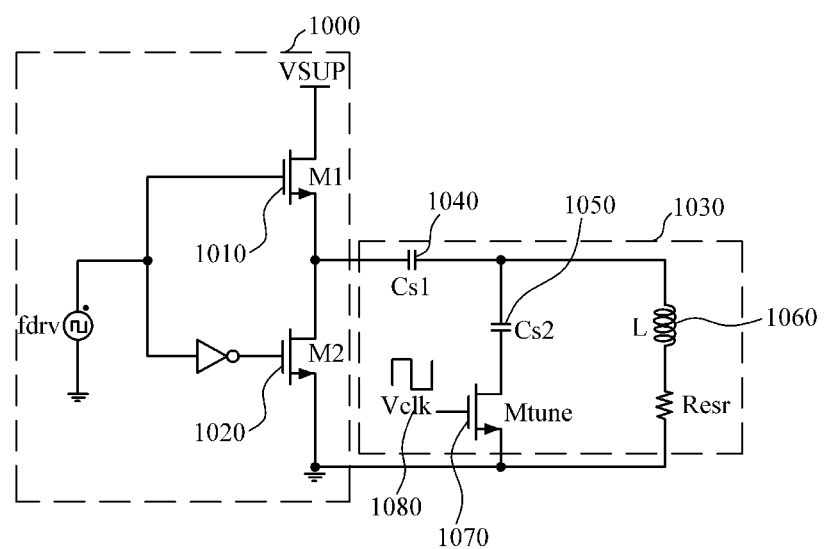
FIG. 10 is a circuit diagram illustrating resonant frequency tuning using switching.

FIG. 10 is a circuit diagram illustrating resonant frequency tuning using switching.

When a device such as a metal-oxide semiconductor field effect transistor (MOSFET) is used as a switch, the switch may operate as a variable resistance according to a voltage applied to a gate thereof. In other words, when a resistance of the MOSFET is infinite, no current flows to a capacitor Cs2, and the circuit operates as if the capacitor Cs2 does not exist. In this case, a resonant frequency is determined by a capacitor Cs1 and an inductor L. Conversely, when the resistance of the MOSFET is 0, the capacitor Cs2 is applied to resonance, and a resonant frequency $f_R$ is determined as shown in Expression 6.

$$f_R = \frac{1}{2\pi\sqrt{L1 \cdot (Cs1 + Cs2)}} \quad \text{[Expression 6]}$$

It is possible to tune a resonant frequency $f_R$ within a range shown in Expression 7 by changing the resistance of the MOSFET.

$$\frac{1}{2\pi\sqrt{L \cdot (Cs1 + Cs2)}} \le f_R \le \frac{1}{2\pi\sqrt{L \cdot Cs1}} \quad \text{[Expression 7]}$$

Although it is apparent that the resonant frequency can be tuned using the above-described method, there is a problem in that a quality factor (Q) is degraded due to a resistance component of the MOSFET. In other words, some of energy applied to a resonator is consumed by MOSFET resistance. To solve this problem, a method using switching may be applied.

Referring to FIG. 10, Mtune 1070 used as a switch is provided, and a power amplifier 1000 composed of transistors M11010 and M2 1020 supplies energy to a resonator 1030 composed of capacitors Cs1 1040 and Cs2 1050 and an inductor (L) 1060. Energy transmission is most efficient when a driving frequency fdry and a resonant frequency of the resonator 1030 are the same. To this end, the resonant frequency of the resonator 1030 can be tuned using a clock signal (Vclk) 1080 applied to the switch (Mtune) 1070.

When the resonant frequency is tuned using the above-described method and the resonant frequency and the clock signal (Vclk) 1080 are not synchronized with each other, an excessive peak current may occur or noise may increase while the capacitor Cs2 1050 is charged or discharged. Also, in terms of energy supplied to the resonator 1030, since the power amplifier 1000 is or is not operated, there is little difference between the above-described method and an energy control method. Further, when energy is transmitted to a PRU through the resonator 1030, since a frequency of the clock signal (Vclk) 1080 is modulated together with the driving frequency fdrv, radiation energy exists over a large spectrum. Such radiation energy may become problematic due to radio wave management standards.

Figure 11:
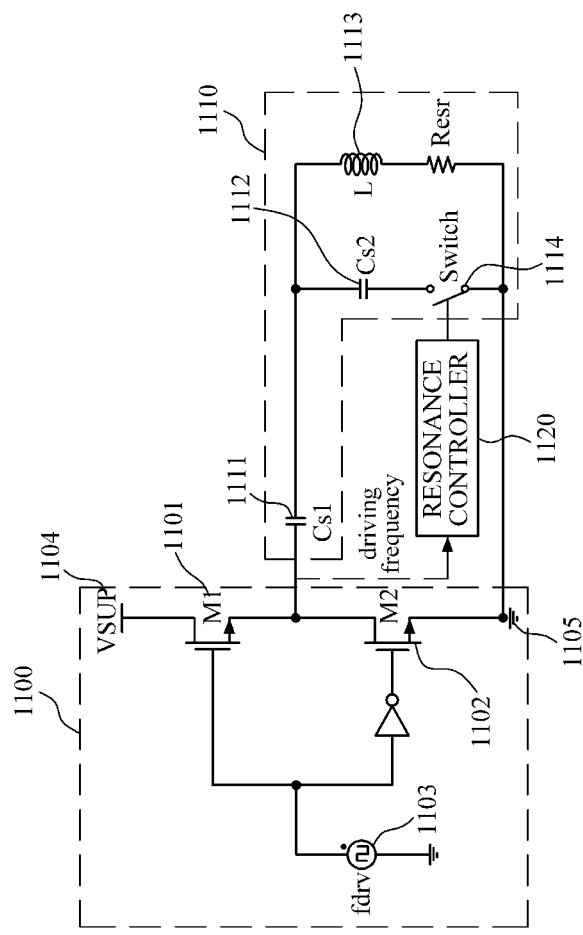
FIG. 11 is a circuit diagram of a wireless power transmitting unit according to an exemplary embodiment of the present invention.

FIG. 11 is a circuit diagram of a wireless power transmitting unit for resonant frequency tuning according to an exemplary embodiment of the present invention.

Referring to FIG. 11, a wireless power transmitting unit includes a power amplifier 1100, a resonator 1110, and a resonance controller 1120.

Figure 1:
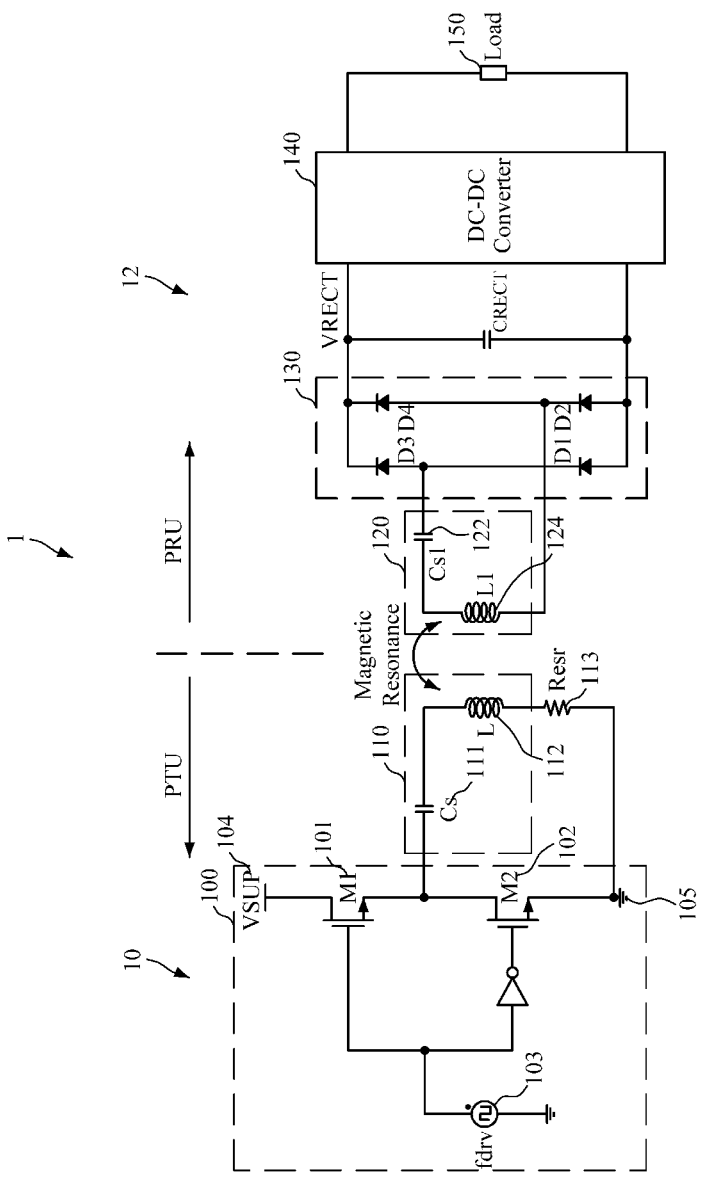
FIG. 1 is a configuration diagram of a general magnetic resonance wireless power transmission system.
Figure 2:
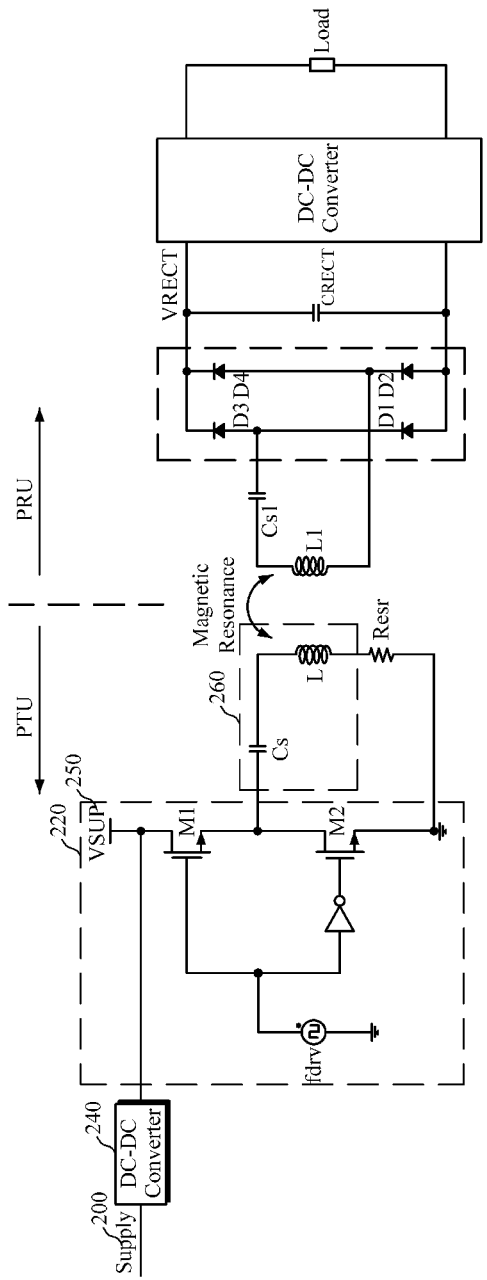
FIG. 2 is a configuration diagram of a magnetic resonance wireless power transmission system using power amplifier supply voltage control.
Figure 3:
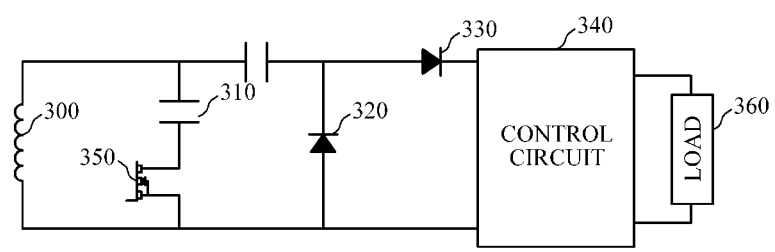
FIG. 3 is a circuit diagram of a wireless power transfer unit that controls supply power by controlling a switch device.
Figure 4:
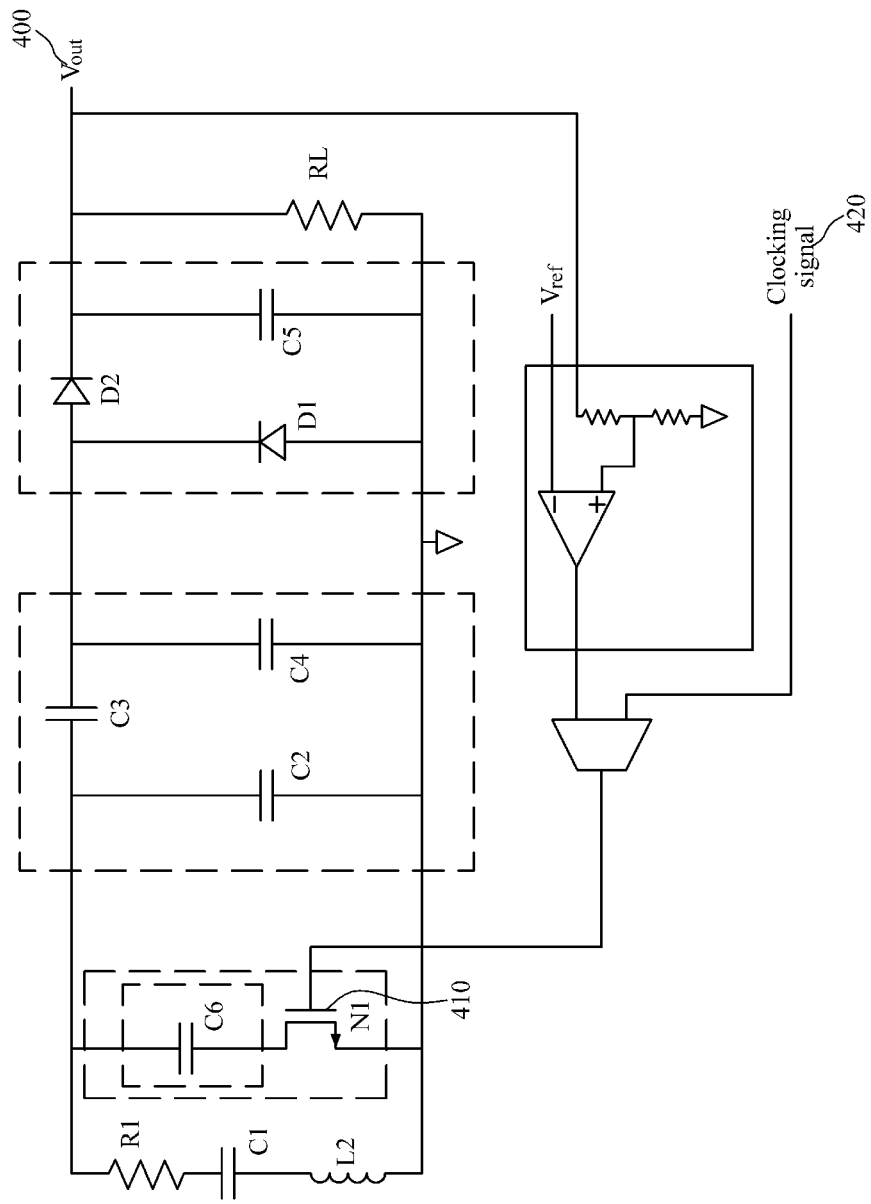
FIG. 4 is a configuration diagram of a wireless power transfer unit using a resonant frequency control method employing a clock signal.

The power amplifier 1100 includes N-channel metal oxide semiconductors (NMOSs) M11101 and M2 1102. Although FIG. 1 shows the power amplifier 1100 that is limited to class-D, the power amplifier 1100 can be replaced by a class-AB or class-B power amplifier. The power amplifier 1100 is operated at a driving frequency (fdrv) 1103. Therefore, an output of the power amplifier 1100 composed of M1 1101 and M2 1102 is in the form of a square wave which varies between a supply voltage (VSUP) 1104 and a ground voltage 1105 at the driving frequency (fdrv) 103.

The resonator 1110 constitutes a resonant tank and wirelessly transmits a wireless power signal output from the power amplifier 1100 to a PRU through magnetic resonance using a resonant frequency of the resonant tank. The resonator 1110 includes a capacitor (Cs1) 1111, an inductor 1113 connected in series with the capacitor (Cs1) 1111, a capacitor (Cs2) 1112 connected in parallel with the inductor 1113 and connected in series with the capacitor (Cs1) 1111, and a switch 1114 connected in series with the capacitor (Cs2) 1112.

The resonance controller 1120 controls a duty ratio using a frequency applied to the resonator 1110 or a frequency signal generated by the resonator 1110, thereby tuning a resonant frequency of the resonator 1110. Specifically, the resonance controller 1120 tunes the resonant frequency of the resonator 1110 by controlling the switch 1114 connected in series with the capacitor (Cs2) 1112. At this time, the switch 1114 is not used as a resistance. Therefore, there is no problem of Q degradation resulting from power consumption caused when the switch 1114 is used as a resistance. Also, the resonance controller 1120 does not use an additional frequency as a frequency for operating the switch 1114 and generates a switch driving signal from the frequency applied to the resonator 1110 or the frequency generated by the resonator 1110. Also, tuning of the resonant frequency employs a method of controlling a duty ratio of a switch rather than a method of changing a switching frequency of a switch illustrated in FIG. 10. A duty ratio is a pulse duty factor U and is a ratio of a pulse width TD of an arbitrary pulse to a pulse repetition period Tp in a periodic pulse train, that is, TD/Tp.

According to the duty ratio control method, a current of a resonator is controlled by periods and thus has a regular form. Therefore, it is possible to solve a problem in that energy is radiated over a large spectrum because a driving frequency of a resonator and a driving frequency of a switch are modulated by the resonant frequency tuning using switching illustrated in FIG. 10.

Figure 12:
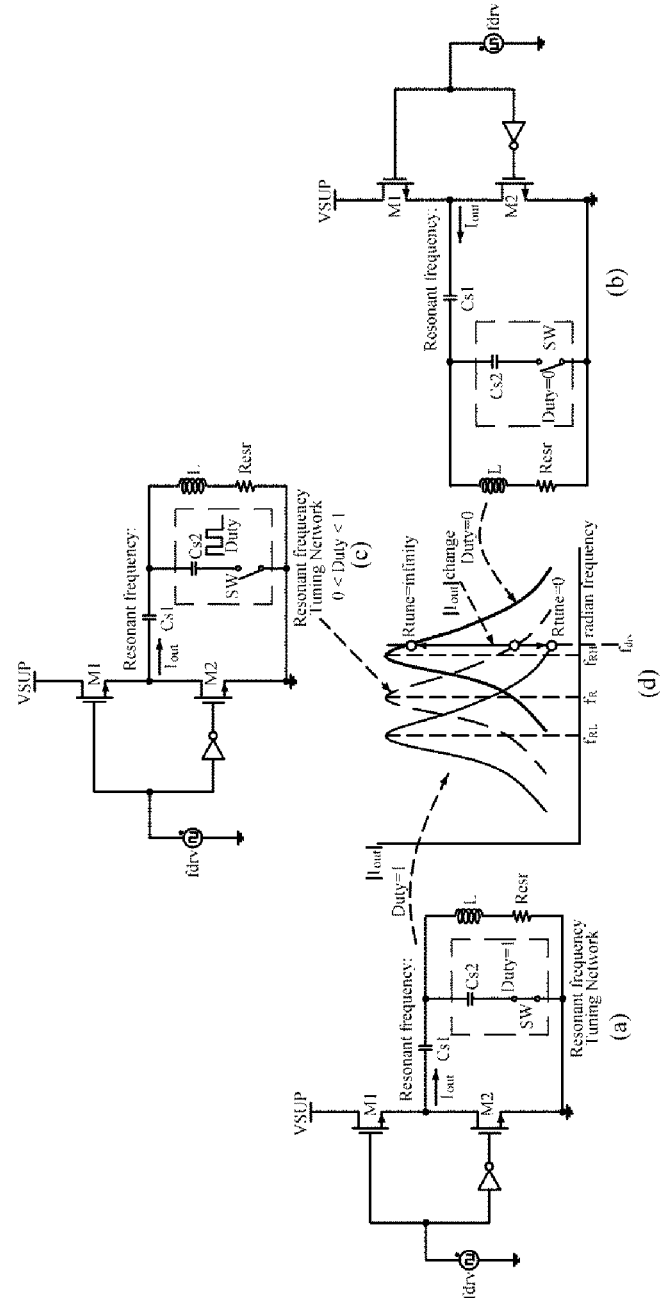
FIG. 12 is a circuit diagram of a wireless power transmitting unit showing examples of resonant frequency tuning and supply power control based on duty control according to an exemplary embodiment of the present invention.

FIG. 12 is a circuit diagram of a wireless power transmitting unit showing examples of resonant frequency tuning and supply power control based on duty control according to an exemplary embodiment of the present invention.

Referring to FIG. 12, when a switch SW is in an on-state (a), resonance occurs due to capacitors Cs1 and Cs2. Conversely, when the switch SW is in an off-state (b), a resonant frequency is determined by Cs1. When a driving frequency fdrv of the switch SW is made to be the same as the resonant frequency and a duty ratio is adjusted, for example, to be 100%, the wireless power transmitting unit operates as if the switch had been turned on (a), and when the duty ratio is adjusted to be 0%, the wireless power transmitting unit operates as if the switch had been turned off (b). At this time, when the duty ratio is between 0% and 100% (c), a degree of a contribution made by the capacitors Cs1 and Cs2 to a resonant tank within one period varies, and the same effect as a shift of the resonant frequency is observed as shown in (d) of FIG. 12. Further, when the resonant frequency is changed as shown in (d) of FIG. 12, a magnitude of a current Iout supplied by an output terminal of the power amplifier is changed by the driving frequency fdrv. Therefore, the resonant frequency can be tuned by adjusting a duty, and further, a supply power of the power amplifier can be changed.

Figure 13:
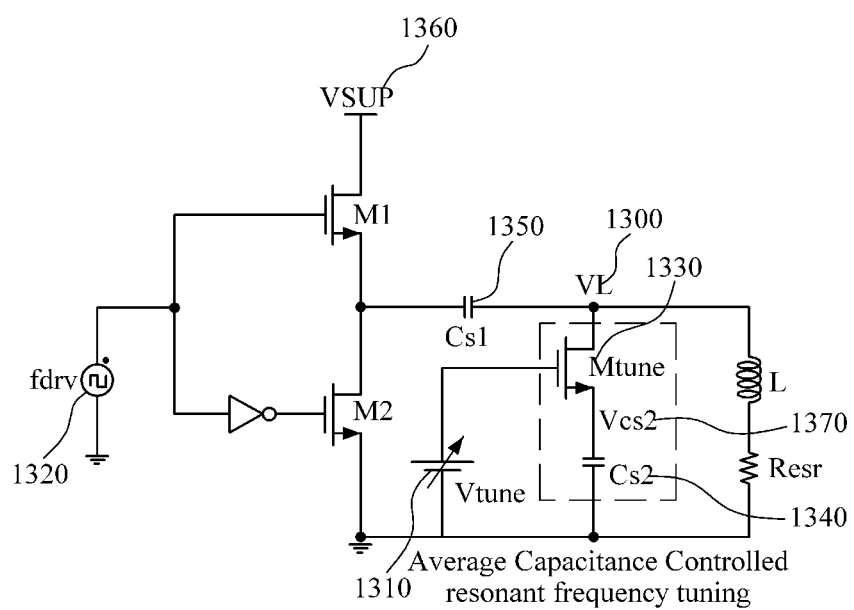
FIG. 13 is a circuit diagram of a TYPE-I wireless power transmitting unit that tunes a resonant frequency through cycle-by-cycle average capacitance control according to a first exemplary embodiment of the present invention.
Figure 14:
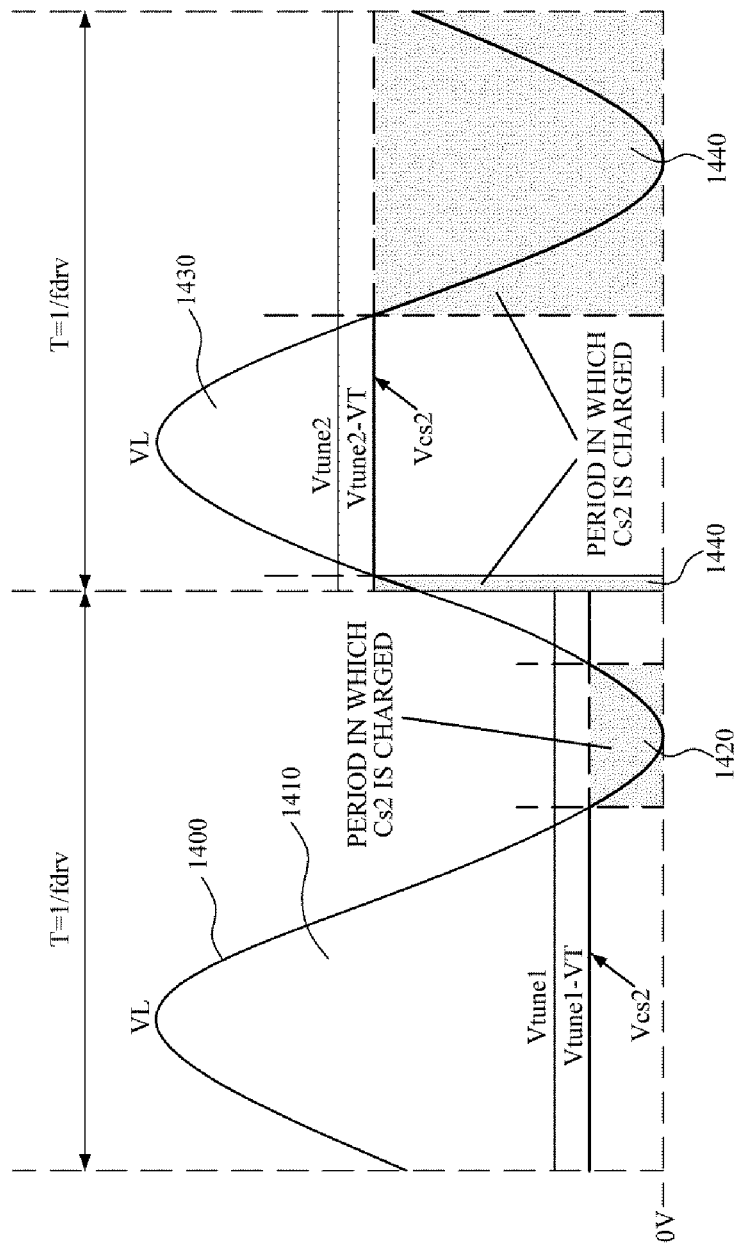
FIG. 14 is a waveform diagram showing a change in a charging period of a capacitor Cs2 according to an adjustment of a tuning voltage Vtune (Vtune1<Vtune2) in the TYPE-I wireless power transmitting unit of FIG. 13.

FIG. 13 is a circuit diagram of a TYPE-I wireless power transmitting unit that tunes a resonant frequency through cycle-by-cycle average capacitance control according to a first exemplary embodiment of the present invention, and FIG. 14 is a waveform diagram showing a change in a charging period of a capacitor Cs2 according to an adjustment of a tuning voltage Vtune (Vtune1<Vtune2) in the TYPE-I wireless power transmitting unit of FIG. 13.

Referring to FIG. 13, according to the present invention, an amount of capacitance is actively changed by periods of a frequency applied to a resonator or a frequency signal induced by the resonator. Therefore, this can be referred to as resonant frequency tuning based on cycle-by-cycle capacitance control.

Referring to FIGS. 13 and 14, an inductor voltage (VL) 1300 varies in a form similar to a sine wave (1400 of FIG. 14) of a driving frequency fdrv 1320. When a tuning voltage applied to a gate of a switch (Mtune) 1330 is Vtune 1310 and the tuning voltage (Vtune) 1310 is equal to or greater than a threshold voltage VT, a capacitor (Cs2) 1340 is charged through the switch (Mtune) 1330 according to an increase in the inductor voltage (VL) 1300 from 0 (1420 and 1440 of FIG. 14). A voltage (VCs2) of the capacitor (CS2) 1340 increases in the same manner as the inductor voltage (VL) 1300. Since the switch (Mtune) 1330 is turned off when the inductor voltage (VL) 1300 increases to be higher than Vtune-VT, the capacitor (CS2) 1340 is not changed any more (1410 and 1430 of FIG. 14). Conversely, the capacitor (CS2) 1340 is involved in resonance when the inductor voltage (VL) 1300 is higher than 0 and lower than Vtune-VT, and only a capacitor (CS1) 1350 is involved in resonance when the inductor voltage (VL) 1300 is equal to or higher than Vtune-VT. Therefore, a time during which the capacitor (CS2) 1340 is involved in resonance within one period is controlled according to the tuning voltage (Vtune) 1310. Since the time during which the capacitor (CS2) 1340 is involved in resonance increases (1440 of FIG. 14) when the tuning voltage (Vtune) 1310 becomes higher, the resonant frequency becomes lower. Conversely, since the time during which the capacitor (CS2) 1340 is involved in resonance is reduced (1420 of FIG. 14) when the tuning voltage (Vtune) 1310 becomes lower, the resonant frequency becomes higher. Therefore, it is possible to control a duty ratio of the switch (Mtune) 1330 with the tuning voltage (Vtune) 1310.

The above-described method enables a very simple and efficient change of a frequency and does not cause driving loss when the switch Mtune is turned on or off. Therefore, the method enables low-power driving and does not affect Q of the resonator. However, when a peak voltage of the inductor voltage (VL) 1300 is very high, the tuning voltage (Vtune) 1310 should be high enough to ensure a frequency variation range. In other words, a range of the tuning voltage (Vtune) 1310 may be affected by the peak of the inductor voltage (VL) 1300. Therefore, since the tuning voltage (Vtune) 1310 needs to be high when Q is very high and a supply voltage (VSUP) 1360 of the power amplifier is high, a variable range of the tuning voltage (Vtune) 1310 may be required to be high according to an overall system.

Figure 15:
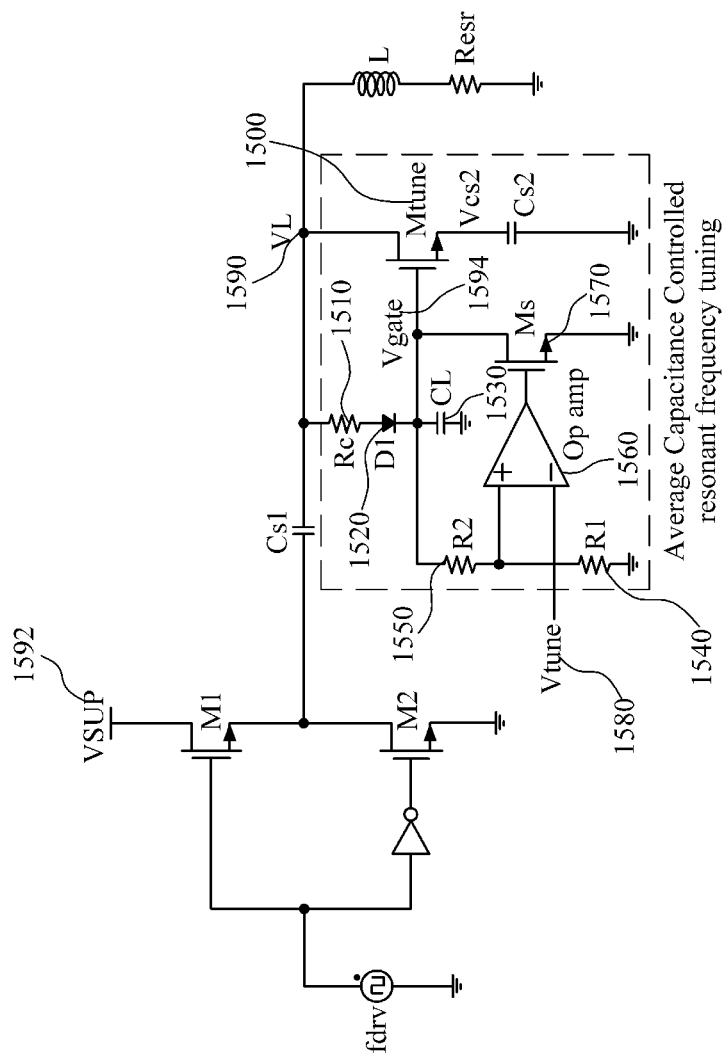
FIG. 15 is a circuit diagram of a wireless power transmitting unit for forming a high variable voltage range with a low voltage according to an exemplary embodiment of the present invention.

FIG. 15 is a circuit diagram of a wireless power transmitting unit for forming a high variable voltage range with a low voltage according to an exemplary embodiment of the present invention.

Referring to FIG. 15, a high variable voltage range can be formed with a low tuning voltage (Vtune) 1580 by adding a resistance (Rc) 1510, a diode (D1) 1520, a capacitor (CL) 1530, resistances (R1 and R2) 1540 and 1550, an operational amplifier (op amp) 1560, and a MOSFET (Ms) 1570 in addition to a switch (Mtune) 1500. When Q is high, an antenna voltage (VL) 1590 may be much higher than a supply voltage VSUP 1592. The antenna voltage (VL) 1590 charges the capacitor (CL) 1530 with the resistance (Rc) 1510 and the diode (D1) 1520. The capacitor (CL) 1530 can be charged up to the maximum of the antenna voltage (VL) 1590. The resistances (R1 and R2) 1540 and 1550, the op amp 1560, and the MOSFET (Ms) 1570 operate as a shunt regulator. When a gate voltage (Vgate) 1594 applied to a gate of the switch (Mtune) 1500 satisfies Expression 8 below, the MOSFET (Ms) 1570 absorbs and consumes energy of the capacitor (CL) 1530.

$$Vgate = Vtune\left(1 + \frac{R2}{R1}\right)$$ [Expression 8]

Therefore, it is possible to amplify the gate voltage (Vgate) 1594. The maximum amount of amplification can be determined according to a peak voltage of the antenna voltage (VL) 1590. When this circuit is used, it is possible to change a duty ratio at which the switch (Mtune) 1500 is operated relatively freely even with the low tuning voltage (Vtune) 1580. Since the switch (Mtune) 1500 consumes almost no energy of the capacitor (CL) 1530 when operated, the resistance (Rc) 1510 may be set to a very high value. Therefore, it is possible to ignore Q degradation of a resonant tank.

Figure 16:
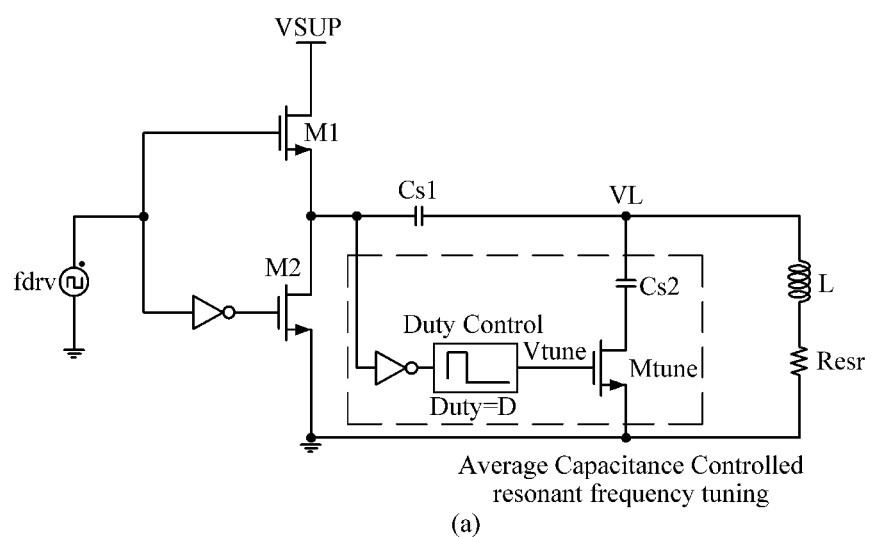
FIG. 16 depicts a circuit diagram (a) of a TYPE-II wireless power transmitting unit that tunes a resonant frequency through cycle-by-cycle average capacitance control using direct duty change according to a second exemplary embodiment of the present invention and a waveform diagram (b) of Vtune.
Figure 16:
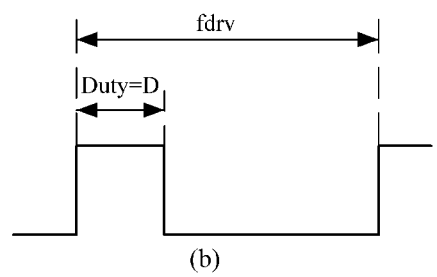

FIG. 16 depicts a circuit diagram (a) of a TYPE-II wireless power transmitting unit that tunes a resonant frequency through cycle-by-cycle average capacitance control using direct duty change according to a second exemplary embodiment of the present invention and a waveform diagram (b) of Vtune.

Referring to FIG. 16, a TYPE-II wireless power transmitting unit additionally includes a duty control circuit that can extract a frequency component from a signal applied to a resonator using a device, such as an inverter, and change a duty D of an extracted frequency signal, and controls a switch Mtune. Even in this case, a resonant frequency can be changed in a way similar to the TYPE-I scheme. Since this scheme does not require a high voltage, there is no need for a high-voltage generator structure shown in FIG. 13, but driving loss may occur when the switch Mtune is operated. However, the driving loss does not degrade Q of the resonator.

As described above, the resonant frequency can be tuned through duty control of the TYPE-I wireless power transmitting unit and the TYPE-II wireless power transmitting unit. Also, Iout supplied at the driving frequency fdrv by the power amplifier is changed when the resonant frequency is tuned. In other words, the resonant frequency of the resonator can be tuned using the proposed methods, and it is possible to change energy supplied to the resonator in this way. Therefore, power supplied to the PRU can be controlled using the above-described two methods. In these cases, since power control is possible without a DC-DC converter, the system can be conveniently implemented. Also, even when the resonant frequency significantly differs from the driving frequency fdrv due to scattering of inductors or capacitors in the resonant tank, the resonant frequency can be tuned. Therefore, regardless of scattering of resonator components, it is possible to implement a highly reproducible system.

Figure 17:
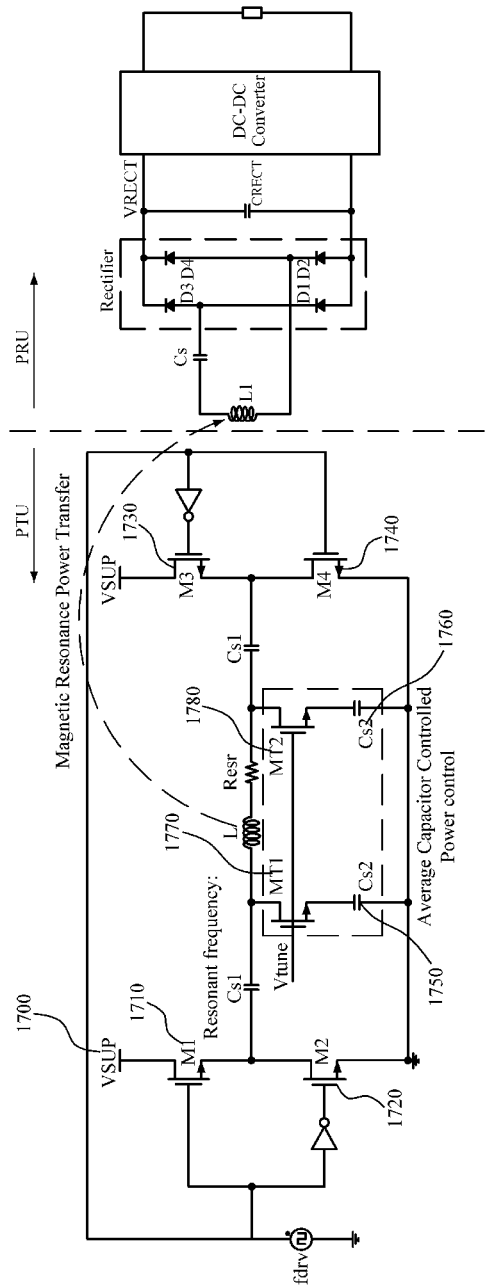
FIG. 17 is a configuration diagram of a TYPE-I wireless power transmission system including a full-bridge power transmitting unit (PTU) and a power receiving unit (PRU) according to the first exemplary embodiment of the present invention.

FIG. 17 is a configuration diagram of a TYPE-I wireless power transmission system including a full-bridge PTU and a PRU according to the first exemplary embodiment of the present invention.

Referring to FIG. 17, a full-bridge power amplifier based on switches (M1, M2, M3, and M4) 1710, 1720, 1730, and 1740 is implemented by adding the switches (M1 to M4) 1710 to 1740 to a power amplifier of a PTU to supply a power which is at most four times higher than a low supply voltage (VSUP) 1700. As shown in FIG. 17, a resonant tank includes two capacitors (Cs2) 1750 and 1760 connected to each other in parallel and two switches (Mtune) 1770 and 1780 connected to each other in parallel.

Figure 18:
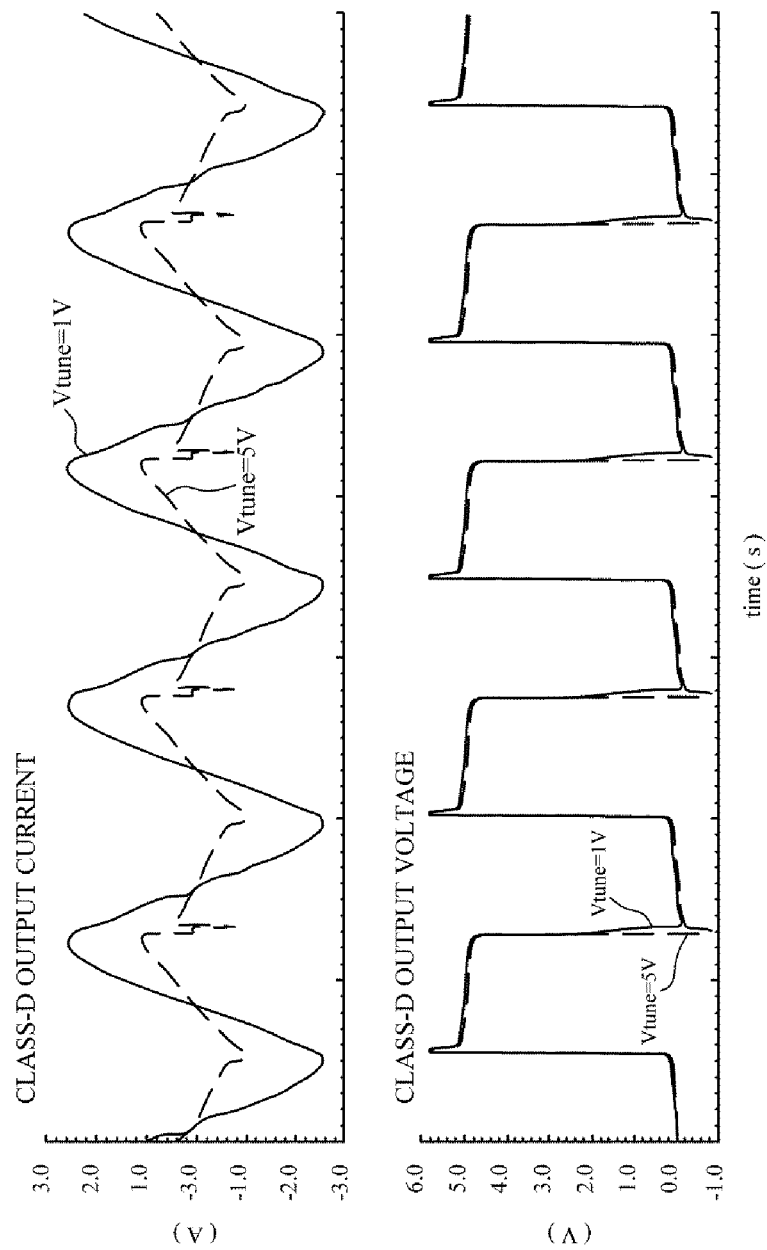
FIG. 18 depicts waveform diagrams of an output current (a class-D output current) and an output voltage (a class-D output voltage) of a power amplifier according to an adjustment of a tuning voltage Vtune in the wireless power transmission system of FIG. 17 having a full-bridge circuit according to an exemplary embodiment of the present invention.
Figure 19:
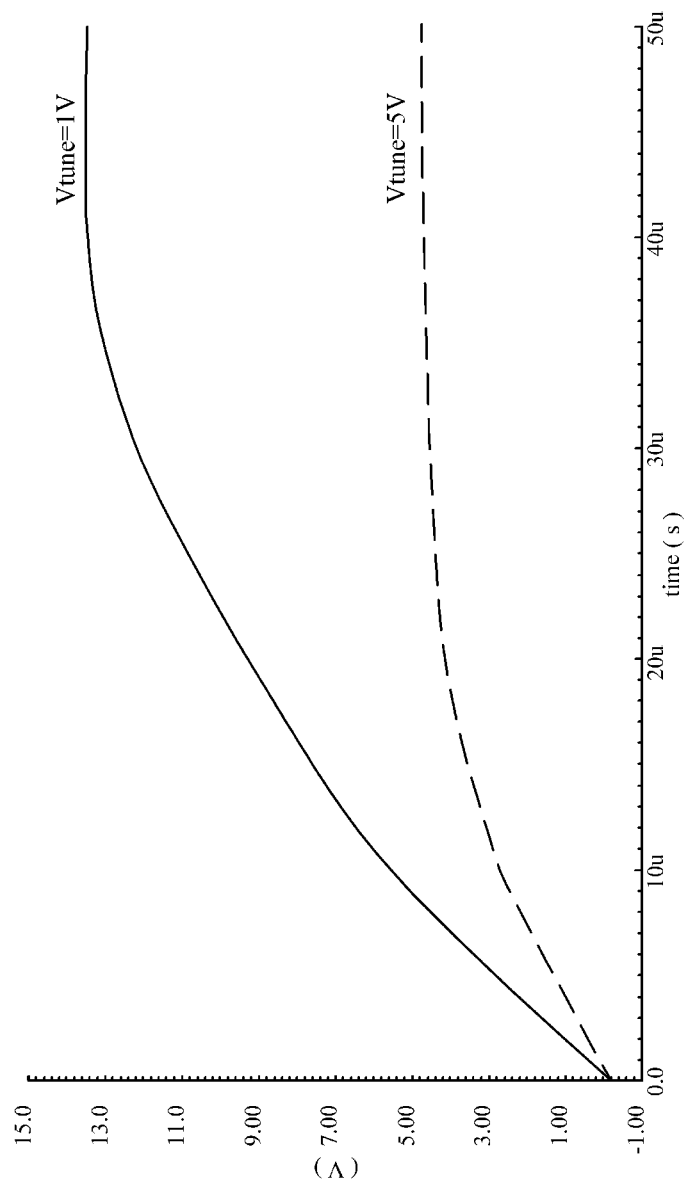
FIG. 19 is a waveform diagram of a VRECT voltage of a PRU according to an adjustment of a tuning voltage Vtune.

FIG. 18 depicts waveform diagrams of an output current (a class-D output current) and an output voltage (a class-D output voltage) of a power amplifier according to an adjustment of a tuning voltage Vtune in the wireless power transmission system of FIG. 17 having a full-bridge circuit according to an exemplary embodiment of the present invention, and FIG. 19 is a waveform diagram of a VRECT voltage of a PRU according to an adjustment of the tuning voltage Vtune.

To simulate a full-bridge circuit, a resonator device and power parameters are assumed to be the following.
VUSP=5 V
PRU output power=1 W
PTU resonant tank: L=400 nH, Cs1=2.8 nF, Cs2=2 nF, fdrv=6.78 MHz
PRU resonant tank: L1=100 nH, Cs=5.5 nF
Coupling coefficient between L and L1: 0.7

Results of a simulation obtained while the tuning voltage Vtune is changed between 1 and 5 using the aforementioned parameters are shown in FIG. 18. Referring to FIG. 18, when the tuning voltage Vtune is reduced, a duty ratio becomes smaller. Therefore, a resonant frequency increases and an output current of a class-D power amplifier increases. When the tuning voltage Vtune increases, the output current is reduced. In other words, the lower the tuning voltage Vtune, the more energy is supplied to the PRU. As shown in FIG. 19, it is possible to see that a rectifier voltage VRECT on the PRU side increases when the tuning voltage Vtune becomes lower and that the rectifier voltage VECT is reduced when the tuning voltage Vtune becomes higher in the simulation. Meanwhile, the above-described simulation is only an exemplary embodiment for proving effects of the present invention, and the present invention is not limited thereto.

Figure 20:
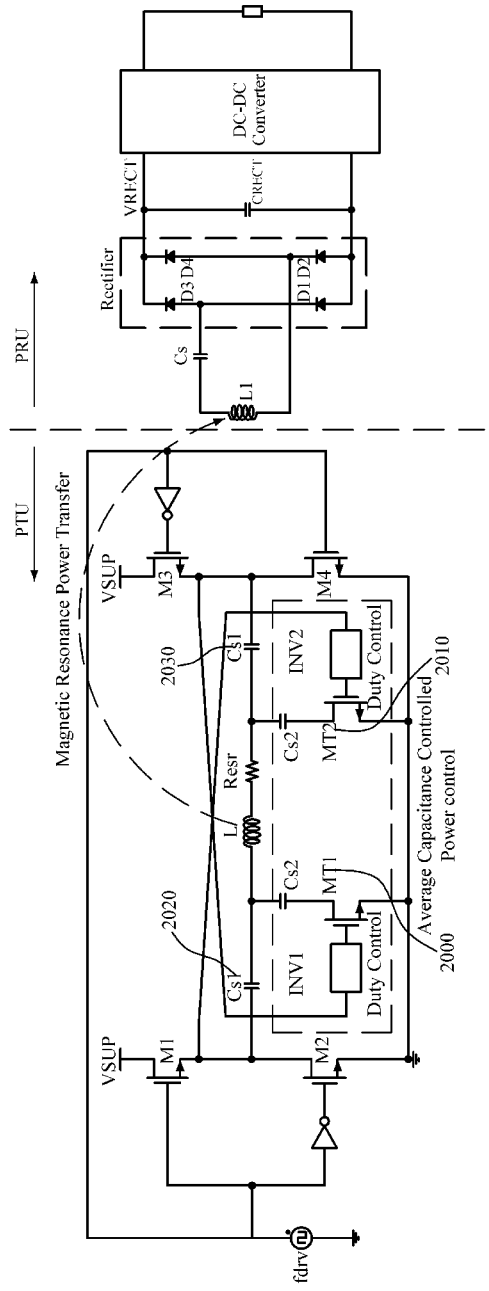
FIG. 20 is a circuit diagram of a TYPE-II wireless power transmission system using average capacitance control according to the second exemplary embodiment of the present invention.
Figure 21:
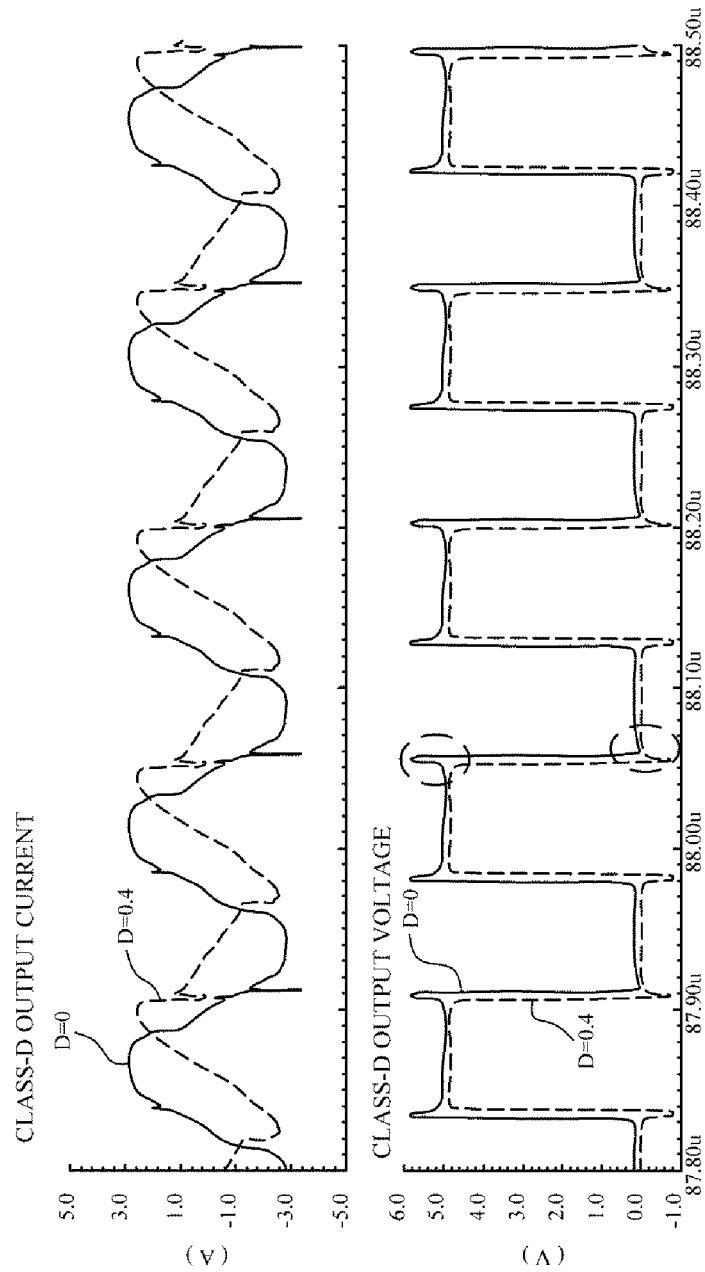
FIG. 21 depicts waveform diagrams showing simulation results of the TYPE-II wireless power transmission system of FIG. 20.

FIG. 20 is a circuit diagram of a TYPE-II wireless power transmission system using average capacitance control according to the second exemplary embodiment of the present invention, and FIG. 21 depicts waveform diagrams showing simulation results of the TYPE-II wireless power transmission system of FIG. 20.

Referring to FIG. 20, MT1 and MT2 2000 and 2010 operate as switches, and since a switch driving frequency is extracted from an input of a resonator, the switch driving frequency is the same as a driving frequency fdrv.

According to an exemplary embodiment, in the TYPE-II scheme, capacitors (Cs1) 2020 and 2030 are set to a slightly small value so that a resonant frequency of the resonator becomes higher than the driving frequency fdrv when MT1/2 2000/2010 is off. According to a simulation performed while a duty is adjusted from 0 to 0.8, since the resonant frequency of the resonator is higher than the driving frequency fdrv when D is low, an output current phase of the power amplifier is ahead of an output voltage. Therefore, as shown in FIG. 21, before the output of the power amplifier becomes low, the output becomes higher than a supply voltage VSUP of the power amplifier due to a resonator current. At this time, the power amplifier performs hard switching, efficiency is degraded, and the power amplifier is heated. Since the resonant frequency of the resonator becomes lower when D increases, a delay of a phase of the output current increases. Since the phase of the output current becomes slower than the phase of the output voltage when the delay becomes a certain level or more, the power amplifier performs a zero-voltage switching (ZVS) operation due to the current of the resonator. When the ZVS operation is performed, heating is reduced. Therefore, efficiency is increased, and electromagnetic interference (EMI) noise is reduced. Meanwhile, the above-described simulation is only an exemplary embodiment for proving effects of the present invention, and the present invention is not limited thereto.

Figure 22:
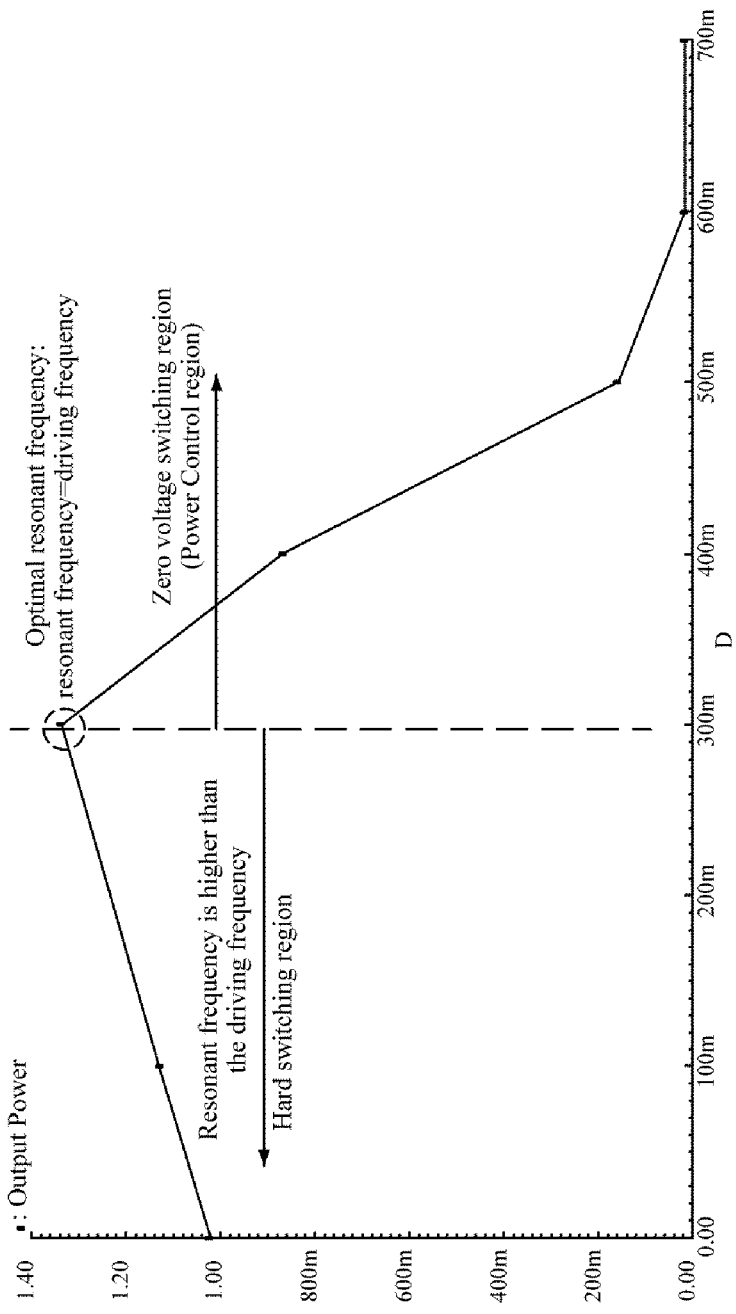
FIG. 22 is a waveform diagram showing a relationship between a power supplied to a PRU and a duty D in a TYPE-II wireless power transmission system according to the second exemplary embodiment of the present invention.

FIG. 22 is a waveform diagram showing a relationship between a power supplied to a PRU and a duty D in a TYPE-II wireless power transmission system according to the second exemplary embodiment of the present invention.

In FIG. 22, the horizontal axis denotes a duty D, and the vertical axis denotes a PRU power. A resonant frequency is lowered when D is increased from 0, and a maximum power point occurs in the case where D is about 0.3. In other words, when D<0.3, the resonant frequency is higher than a driving voltage fdrv. In this case, a power amplifier performs hard switching. A full matching state is when D=0.3, and the power amplifier enters a state in which it is possible to perform a ZVS operation and also control power when D>0.3. Meanwhile, the above-described simulation is only an exemplary embodiment for proving effects of the present invention, and the present invention is not limited thereto.

Effects of the present invention have been proved through the above simulations. In brief, the present invention provides the following effects. First, the resonant frequency can be electrically tuned. In other words, it is very important to match resonators between a PTU and a PRU in a wireless power transmission system, and resonant frequencies are not regularized by tuning a passive device, but resonant frequency tuning is possible using only an electric signal without tuning a passive device. Further, a power can be adjusted. In other words, since the resonant frequency can be electrically tuned and the amount of current supplied to the resonator of a PTU can be controlled using the resonant frequency, power control is possible.

Figure 23:
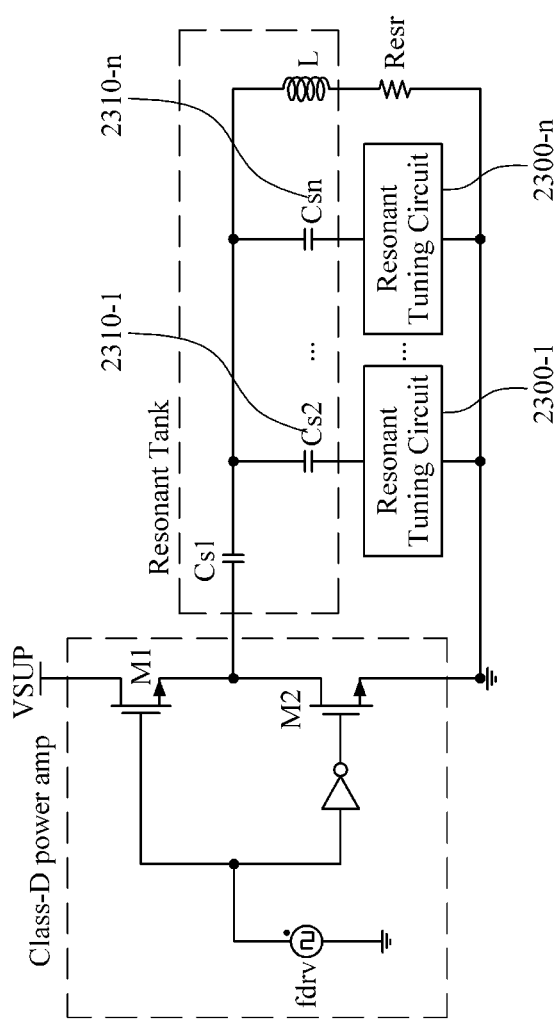
FIG. 23 is a circuit diagram of a wireless power transmitting unit whose tuning range can be extended using a plurality of tuning circuits and a plurality of capacitors according to an exemplary embodiment of the present invention.

FIG. 23 is a circuit diagram of a wireless power transmitting unit whose tuning range can be extended using a plurality of tuning circuits and a plurality of capacitors according to an exemplary embodiment of the present invention.

Referring to FIG. 23, a tuning range can be extended using a plurality of tuning circuits 2300-1 to 2300-n and a plurality of capacitors 2310-1 to 2310-n. Although FIG. 23 shows an example in which a class-D power amplifier operates in consideration of efficiency of the power amplifier, the proposed invention in which the class-D power amplifier is replaced by a class-A, class-AB, or class-B power amplifier having an existing linear amplifier structure can operate in the same principle when efficiency is not so important.

Figure 24:
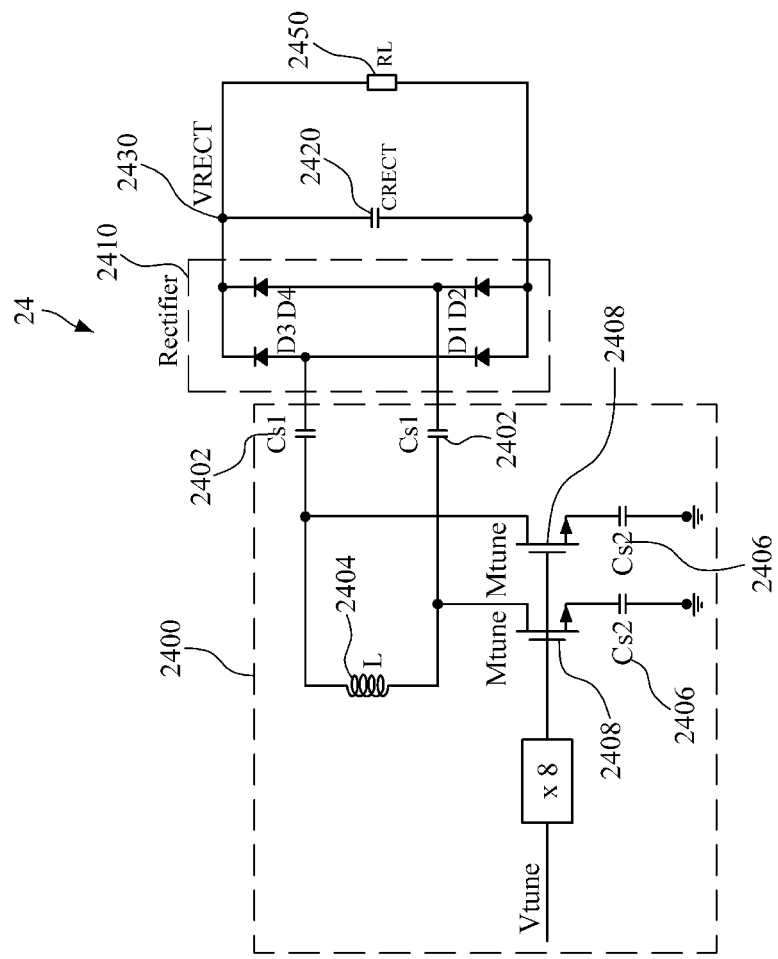
FIG. 24 is a circuit diagram of a PRU according to an exemplary embodiment of the present invention.

FIG. 24 is a circuit diagram of a PRU according to an exemplary embodiment of the present invention.

Referring to FIG. 24, a configuration of a resonant tank can be applied to a PRU as well as a PTU. A PRU 24 includes a resonator 2400, a rectifier 2410, and a load 2450.

The resonator 2400 includes two capacitors (Cs1) 2402, an inductor (L) 2404, two capacitors (Cs2) 2406, and two switches (Mtune) 2408. The rectifier 2410 is composed of diodes D1 to D4. Since an output of the rectifier 2410 is a full-wave rectified voltage, a capacitor (CRECT) 2420 is used to convert the output into a DC voltage. A DC voltage (VRECT) 2430 generated by the capacitor (CRECT) 2420 is converted into a voltage suited to the load 2450 using a DC-DC converter, and then the load 2450 is operated.

When the TYPE-I structure of the first exemplary embodiment described above with reference to FIG. 13 is configured in the resonant tank of the PRU to control power, a tuning voltage Vtune is applied to gates of the switches (Mtune) 2408. At this time, referring to FIG. 24, the tuning voltage Vtune can be amplified by a factor of 8 and applied to the gates of the switches (Mtune) 2408. Since the tuning voltage (Vtune) is controlled to be 0 to 1 V, the voltage applied to the switches (Mtune) 2408 is 0 to 8 V.

Figure 25:
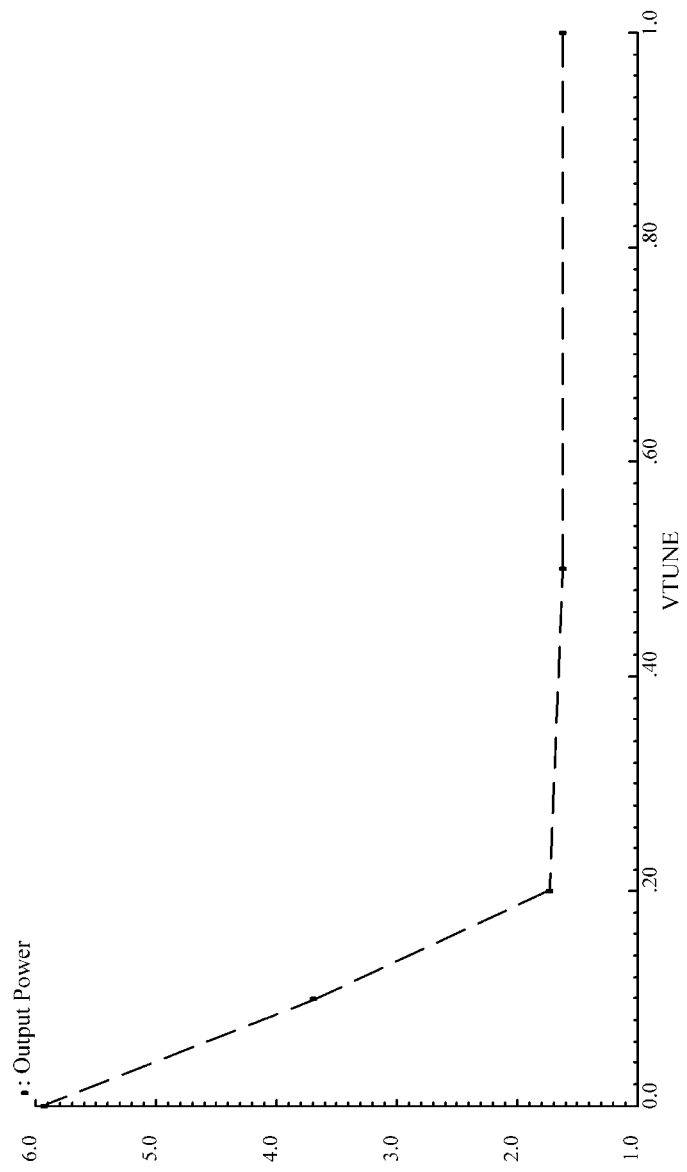
FIG. 25 is a waveform diagram showing a power supplied to a load RL according to an exemplary embodiment of the present invention.

FIG. 25 is a waveform diagram showing a power supplied to a load RL according to an exemplary embodiment of the present invention.

In FIG. 25, the horizontal axis denotes a tuning voltage Vtune and the vertical axis denotes a power [W] supplied to the load RL. As shown in FIG. 25, an output power supplied to the load RL can be controlled by adjusting the tuning voltage Vtune as shown in FIG. 23. Meanwhile, the above-described simulation is only an exemplary embodiment for proving effects of the present invention, and the present invention is not limited thereto.

Exemplary embodiments of the present invention have been described above. Those of ordinary skill in the art to which the present invention pertains should understand that various changes can be made without departing from the spirit of the present invention. Accordingly, the disclosed embodiments should be considered in a descriptive sense and not in a restrictive sense. The scope of the present invention is defined by the claims, and differences in scope equivalent to the claims should be construed as being included in the present invention.

The invention claimed is:

1. A wireless power transmitting unit, comprising:
   a power amplifier configured to amplify a power signal using a driving frequency signal;
   a resonator constituting a resonant tank, and configured to wirelessly transmit the amplified power signal through magnetic resonance using a resonant frequency of the resonant tank; and a resonance controller configured to tune the resonant frequency of the resonator by controlling a duty ratio with a frequency signal generated by the resonator, wherein the resonance controller is configured to control a duty ratio of a switch of the resonator by changing a tuning voltage that is applied to a gate of the switch, and wherein the resonance controller is configured to control the duty ratio of the switch using the changed tuning voltage and an inductor voltage varying in a sinusoidal waveform at a source of the switch.

2. The wireless power transmitting unit of claim 1, wherein the resonator comprises:
   a first capacitor,
   an inductor connected in series with the first capacitor,
   a second capacitor connected in parallel with the inductor, and connected in series with the first capacitor, and
   the switch comprising the gate, the source and a drain, which is connected in series with the second capacitor, and
   wherein the resonant frequency is tuned according to a period in which the second capacitor is charged, which is dependent on the duty ratio of the switch.

3. The wireless power transmitting unit of claim 1, wherein the resonance controller generates a switch driving signal using the frequency signal generated by the resonator, operates the switch using the switch driving signal, and tunes the resonant frequency by actively controlling an amount of capacitance through controlling the duty ratio of the switch.

4. The wireless power transmitting unit of claim 3, wherein the resonance controller extracts a frequency component from the frequency signal generated by the resonator, and directly changes a duty ratio of an extracted frequency signal.

5. The wireless power transmitting unit of claim 1, wherein the resonance controller controls the duty ratio of the switch by amplifying the tuning voltage.

6. The wireless power transmitting unit of claim 1, wherein, when the resonance controller tunes the resonant frequency of the resonator, a magnitude of a current supplied from an output terminal of the power amplifier is adjusted, and a supply power of the power amplifier is adjusted.

7. The wireless power transmitting unit of claim 1, wherein the power amplifier comprises a full-bridge structure.

* * * * *